US008685824B2

(12) United States Patent
Huang et al.

(10) Patent No.: US 8,685,824 B2
(45) Date of Patent: Apr. 1, 2014

(54) HYBRID HIGH VOLTAGE DEVICE AND MANUFACTURING METHOD THEREOF

(75) Inventors: Tsung-Yi Huang, Hsinchu (TW); Chien-Hao Huang, Magong (TW)

(73) Assignee: Richtek Technology Corporation, R.O.C., Hsin-Chu (TW)

( * ) Notice: Subject to any disclaimer, the term of this patent is extended or adjusted under 35 U.S.C. 154(b) by 110 days.

(21) Appl. No.: 13/529,963

(22) Filed: Jun. 21, 2012

(65) Prior Publication Data

US 2013/0341719 A1 Dec. 26, 2013

(51) Int. Cl.
*H01L 21/336* (2006.01)
(52) U.S. Cl.
USPC .................. 438/286; 257/343; 257/E29.268; 257/E29.256
(58) Field of Classification Search
CPC ............ H01L 29/7835; H01L 29/0634; H01L 29/7816; H01L 29/66681; H01L 29/7833
USPC .......... 438/286, 306; 257/335, 336, 343, 408, 257/E29.268, E29.256
See application file for complete search history.

(56) References Cited

U.S. PATENT DOCUMENTS 5,304,827 A * 4/1994 Malhi et al. ................... 257/262

* cited by examiner

*Primary Examiner* — David Vu
(74) *Attorney, Agent, or Firm* — Tung & Associates

(57) ABSTRACT

The present invention discloses a hybrid high voltage device and a manufacturing method thereof. The hybrid high voltage device is formed in a first conductive type substrate, and includes at least one lateral double diffused metal oxide semiconductor (LDMOS) device region and at least one vent device region, wherein the LDMOS device region and the vent device region are connected in a width direction and arranged in an alternating order. Besides, corresponding high voltage wells, sources, drains, body regions, and gates of the LDMOS device region and the vent device region are connected to each other respectively.

7 Claims, 7 Drawing Sheets

HYBRID HIGH VOLTAGE DEVICE AND MANUFACTURING METHOD THEREOF

BACKGROUND OF THE INVENTION

1. Field of Invention

The present invention relates to a hybrid high voltage device and a manufacturing method thereof; particularly, it relates to such hybrid high voltage device and manufacturing method thereof wherein the conduction resistance is reduced.

2. Description of Related Art

FIGS. 1A-1C show a cross-section view, a 3D (3-dimensional) view, and a top view of a prior art lateral double diffused metal oxide semiconductor (LDMOS) device 100, respectively. As shown in FIGS. 1A-1C, a P-type substrate 11 has multiple isolation regions 12 by which a device region of the LDMOS device 100 is defined (as indicated by a bold frame shown in FIG. 1C). The isolation regions 12 and a field oxide region 12a for example are a local oxidation of silicon (LOCOS) structure or a shallow trench isolation (STI) structure, the former being shown in the figures. The LDMOS device 100 includes an N-type well 14, a gate 13, a drain 15, a source 16, a body region 17, a body electrode 17a, and the field oxide region 12a. The well 14, the drain 15 and the source 16 are defined by lithography process steps and formed by ion implantation process steps, wherein the lithography process step defines the implantation region by a photoresist mask together with a self-alignment effect provided by all or part of the gate 13, and the ion implantation process step implants N-type impurities to the defined region in the form of accelerated ions. The drain 15 and the source 16 are beneath the gate 13 and at different sides thereof respectively. The body region 17 and the body electrode 17a are defined by lithography process steps and formed by ion implantation process steps, wherein the lithography process step defines the implantation region by a photoresist mask together with a self-alignment effect provided by all or part of the gate 13, and the ion implantation process step implants P-type impurities to the defined region in the form of accelerated ions. Part of the gate 13 is above the field oxide region 12a in the LDMOS device 100. The LDMOS device is a high voltage device designed for applications requiring higher operation voltages. However, for operating in the high voltage environment with a higher breakdown voltage, the conduction resistance is usually sacrificed (i.e., higher conduction resistance), and thus the application range of the LDMOS device is limited. Particularly, if the LDMOS device 100 is an ultra-high voltage device, i.e., with operation voltage higher than 500V, it is a dilemma among the performance of the conduction resistance, the breakdown voltage, and the channel width; increasing the channel width, changing parameters of ion implantation process steps, or adding additional ion implantation process steps can reduce the conduction resistance, but the breakdown voltage will be sacrificed, or the manufacturing cost will be increased and the size of the device may be out of a desired range. Therefore, under the limitations of the manufacturing cost, the breakdown voltage and the channel width, it is difficult to further reduce the conduction resistance of the LDMOS device.

In view of above, to overcome the drawbacks in the prior art, the present invention proposes a hybrid high voltage device and a manufacturing method thereof, which reduces the conduction resistance without sacrificing the breakdown voltage, so that the LDMOS device may have a broader application range, in which additional manufacturing process steps are not required. Besides, the parameters of the ion implantation process steps of the hybrid high voltage device of the present invention can be applied to forming a low voltage device on the same substrate, i.e., the hybrid high voltage device and the low voltage device can be integrated in the same chip and manufactured by the same process steps.

TOTAL OF THE INVENTION

A first objective of the present invention is to provide a hybrid high voltage device.

A second objective of the present invention is to provide a manufacturing method of a hybrid high voltage device.

To achieve the objective mentioned above, from one perspective, the present invention provides a hybrid high voltage device formed in a first conductive type substrate, wherein the substrate has an upper surface. The hybrid high voltage device includes: at least one lateral double diffused metal oxide semiconductor (LDMOS) device region, which is formed in the substrate, wherein the LDMOS device region includes a first source, a first drain, a first body region, and a first gate; and at least one vent device region, which is formed in the substrate, wherein the vent device includes a second source, a second drain, a second body region, and a second gate, and wherein the vent device has a conduction resistance which is lower than a conduction resistance of the LDMOS device region; wherein the LDMOS device region and the vent device region are arranged in an alternating order in a width direction, and the first source, the first drain, the first body region, and the first gate are physically connected or electrically connected to the second source, the second drain, the second body region, and the second gate respectively.

From another perspective, the present invention provides a manufacturing method of a hybrid high voltage device, including: providing a first conductive type substrate, wherein the substrate has an upper surface; forming at least one lateral double diffused metal oxide semiconductor (LDMOS) device region in the substrate; and forming at least one double diffused drain metal oxide semiconductor (DDDMOS) device region in the substrate; wherein the LDMOS device region and the DDDMOS device region are arranged in an alternating order in a width direction, and a first source, a first drain, a first body region, and a first gate of the LDMOS device region are formed by common steps with and are physically connected or electrically connected to a second source, a second drain, a second body region, and a second gate of the DDDMOS device region respectively.

In one preferable embodiment, the LDMOS device region includes: a second conductive type first high voltage well, which is formed in the substrate beneath the upper surface; a field oxide region, which is formed on the upper surface, and is located in the high voltage well from top view; the first gate, which is formed on the upper surface, wherein part of the first gate is above the first field oxide region; the second conductive type first source and the second conductive type first drain, which are formed beneath the upper surface at two sides of the first gate respectively, wherein the first drain and the first source are separated by the first gate and the field oxide region from top view, and the first drain is formed in the first high voltage well; and the first conductive type first body region, which is formed in the substrate beneath the upper surface, wherein the first source is in the first body region; and the vent device region includes: a second conductive type second high voltage well, which is formed in the substrate beneath the upper surface, and is connected to the first high voltage well; the second gate, which is formed on the upper surface, and is connected to the first gate; the second conductive type second source and the second conductive type second drain, which are formed beneath the upper surface at two sides of the second gate respectively, wherein the second drain and the second source are separated by the second gate from top view, and the second drain is formed in the second high voltage well, the second source being connected to the first source, and the second drain being connected to the first drain; and the first conductive type second body region, which is formed in the substrate beneath the upper surface, wherein the second source is in the first body region.

In one preferable embodiment, the vent device region has a width not wider than 0.4 um.

In another embodiment, the first body region and the second body region may be isolated from the substrate by the first high voltage well and the second high voltage well respectively, such that the first body region and the second body region are not in direct contact with to the substrate.

In one another embodiment, at least part of the first body region and at least part of the second body region may be physically connected to the substrate, or indirectly connected to the substrate through a first conductive type connection well, such that the first body region and the second body region are electrically connected to the substrate.

In one another embodiment, the hybrid high voltage device may further include: a dielectric layer, which is formed above the second gate and the second high voltage well; and a conductive layer, which is formed above the dielectric layer, wherein the conductive layer overlaps at least part of the second high voltage well between the second gate and the second drain from top view.

In the aforementioned embodiment, the conductive layer is preferably electrically connected to the second gate.

In another embodiment, the first source and the second source are preferably integrated as one piece, and the first drain and second drain are preferably integrated as one piece, such that the LDMOS device region and the vent device region form a single device.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
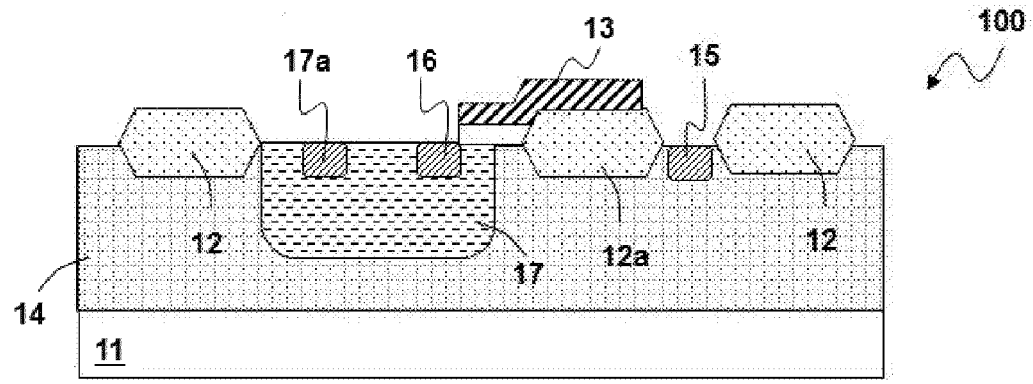
FIGS. 1A-1C show a cross-section view, a 3D (3-dimensional) view, and a top view of a prior art LDMOS device 100 respectively.
Figure 1B:
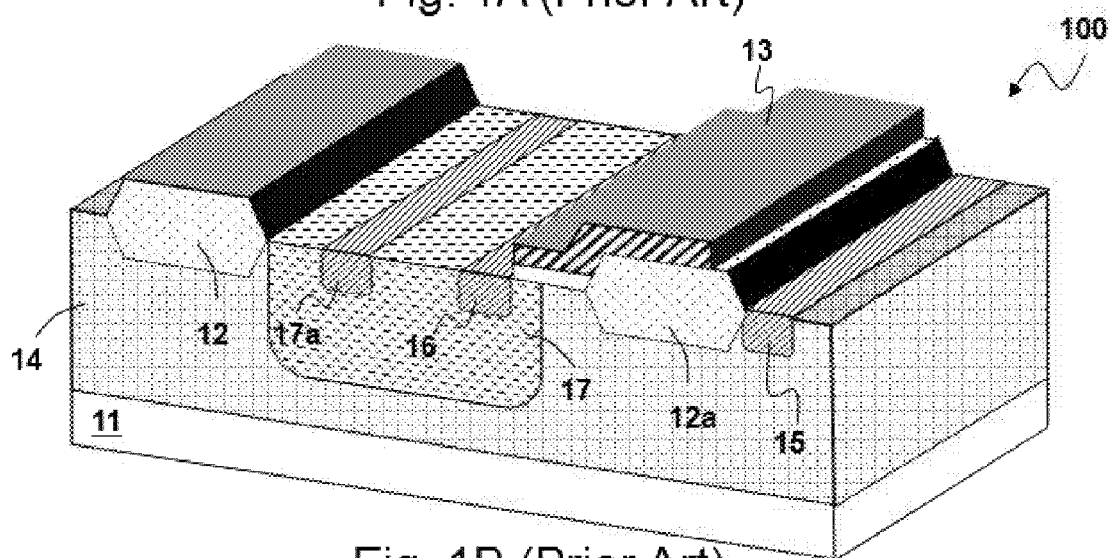
Figure 1C:
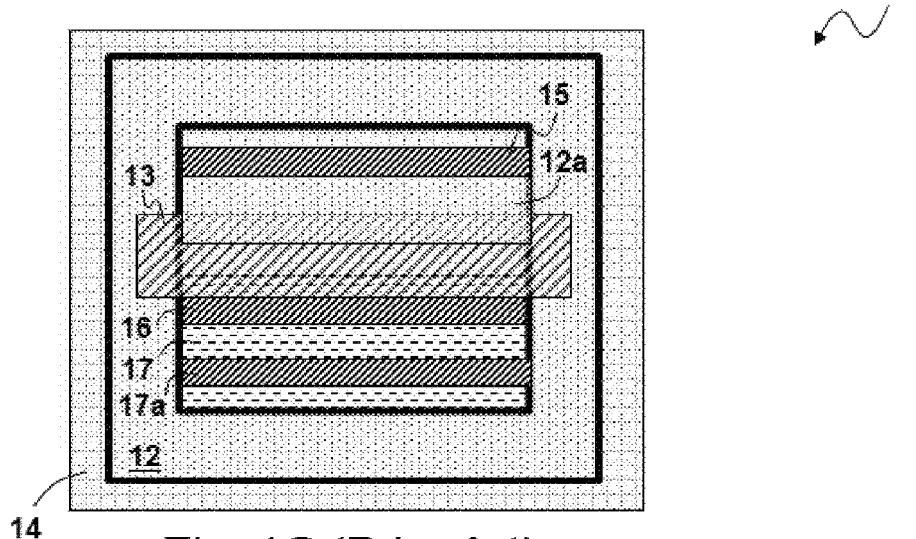
Figure 2A:
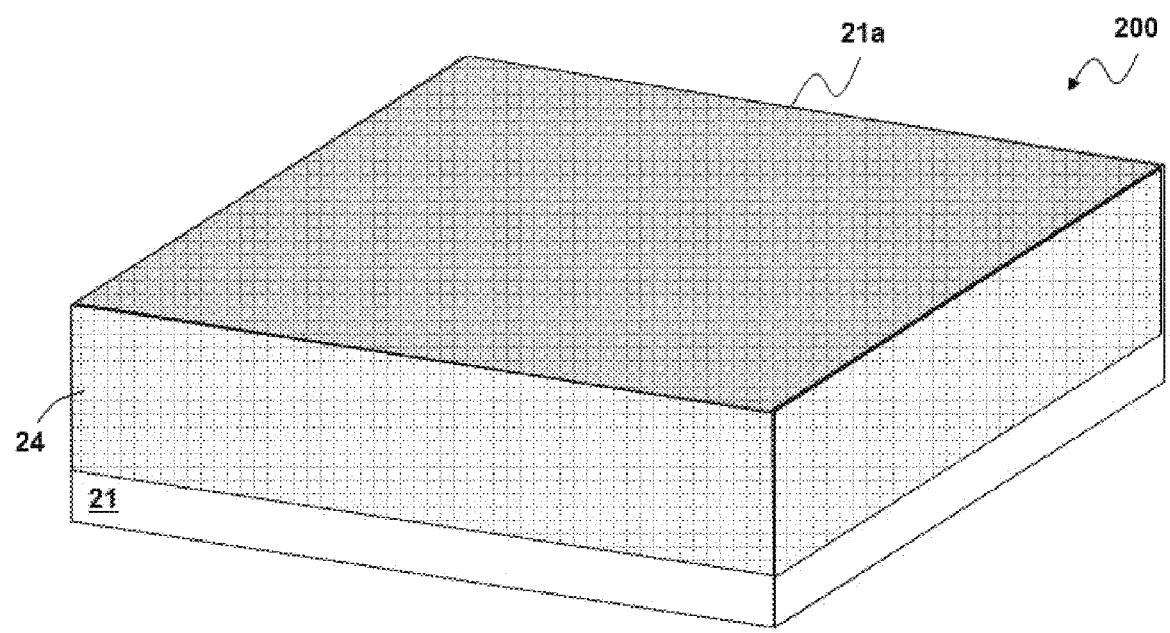
FIGS. 2A-2D show a first embodiment of the present invention.
Figure 2B:
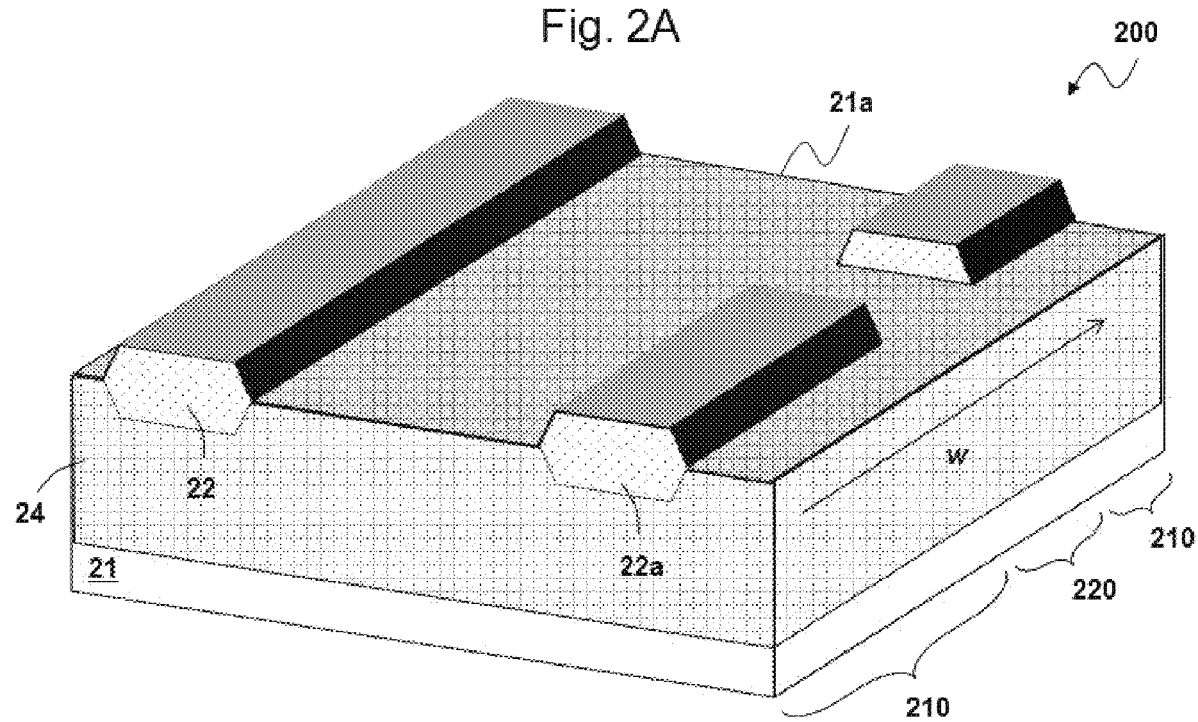
Figure 2C:
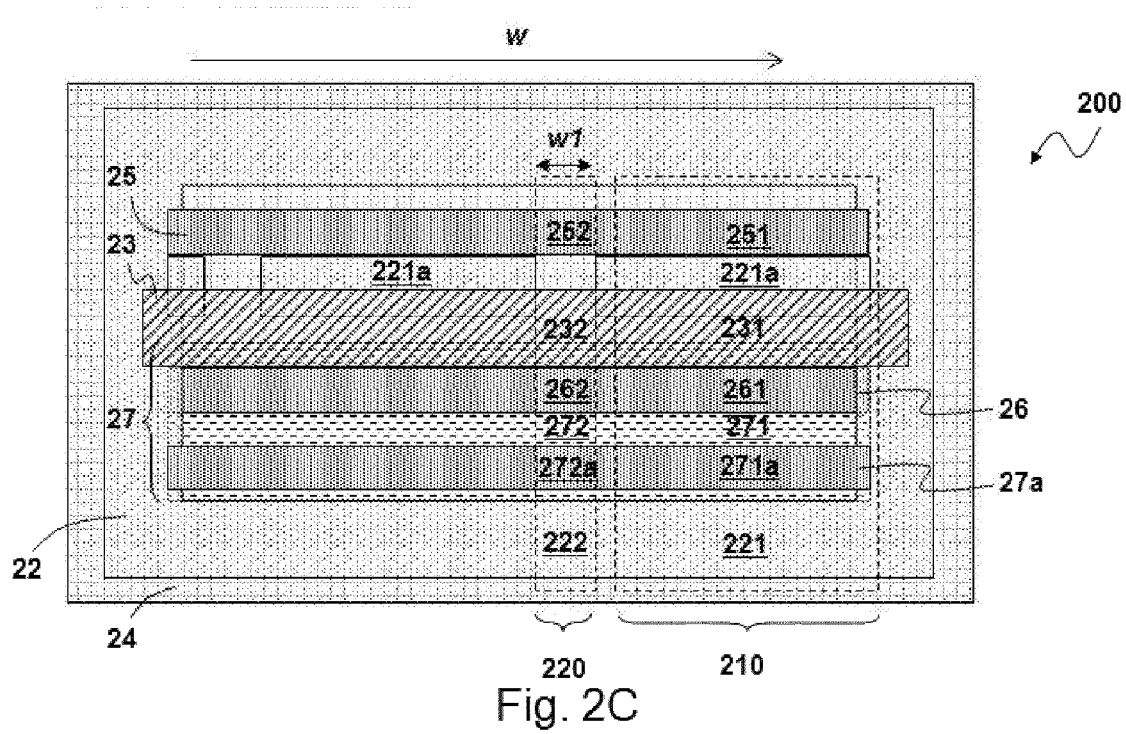
Figure 2D:
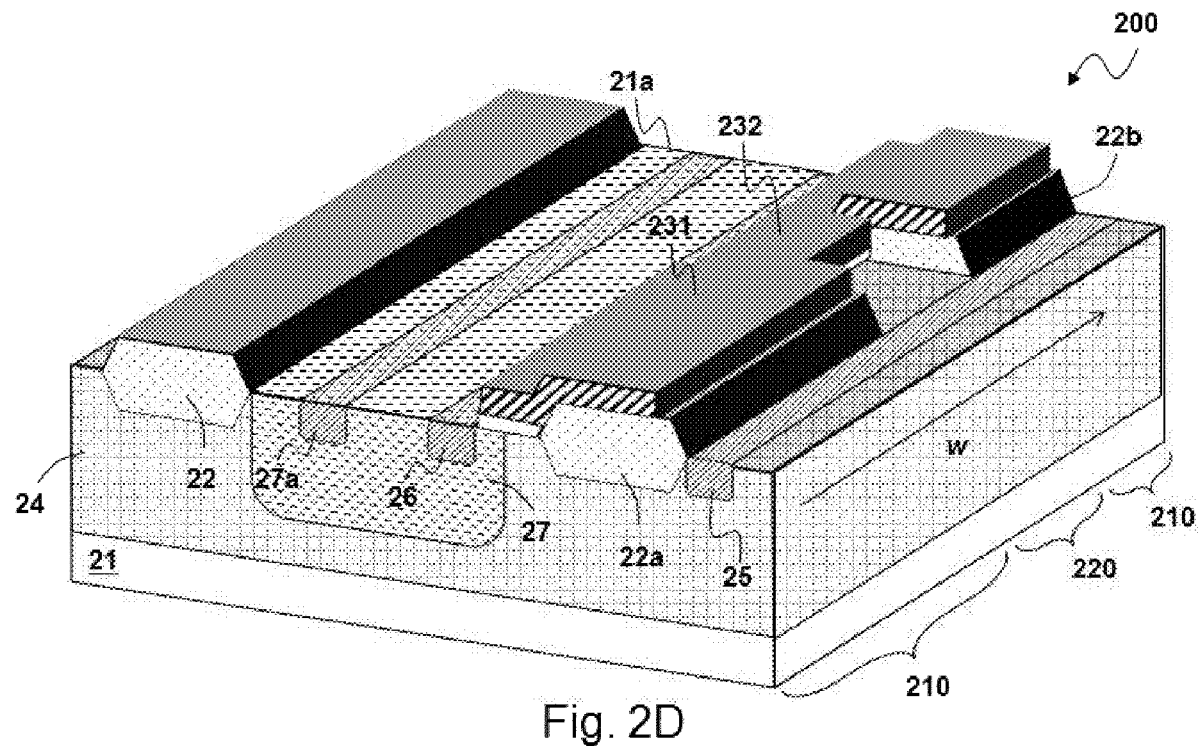

Please refer to FIGS. 2A-2D for a first embodiment according to the present invention, wherein FIGS. 2A-2B and 2D are 3D schematic diagrams showing a manufacturing method of a hybrid high voltage device 200 according to the present invention, and FIG. 2C is a top view of the hybrid high voltage device 200. As shown in FIG. 2A, first, a substrate 21 with an upper surface 21a is provided, wherein the substrate 21 is for example but not limited to a P-type substrate (or an N-type substrate in another embodiment). The substrate 21 for example is a non-epitaxial silicon substrate, or an epitaxial substrate. Next, an N-type high voltage well 24 is defined by a lithography process step and formed beneath the upper surface 21a by an ion implantation process step, wherein the lithography process step defines the implantation region by a photoresist mask (not shown), and the ion implantation process step implants N-type impurities to the defined region in the form of accelerated ions. Next, as shown in FIG. 2B, an isolation region 22 and field oxide regions 22a are formed on the upper surface 21a, wherein the isolation region 22 and the field oxide regions 22a are, for example, a LOCOS or an STI structure (the former being shown in FIGS. 2A-2C). The isolation region 22 and the field oxide regions 22a may be formed by for example but not limited to the same process steps, and the isolation region 22 and the field oxide regions 22a are located in the high voltage well 24 from top view (the drawings do not show this top view but illustrate it by the 3D diagrams of FIGS. 2B and 2D). The hybrid high voltage device 200 includes at least one lateral double diffused metal oxide semiconductor (LDMOS) device region and at least one other device region, which has a lower conduction resistance compared to the LDMOS device region. The device region with a lower conduction resistance is named a "vent device region" in the present invention, because it provides a current path with a lower conduction resistance. This vent device region may adopt any device structure which has a lower conduction resistance compared to that of the LDMOS device region, for example but not limited to a double diffused drain metal oxide semiconductor (DDDMOS) device structure. Next, referring to FIGS. 2C and 2D, a gate 23, a drain 25, a source 26, a body region 27, and a body electrode 27a are formed. As shown in the figures, the gate 23 is formed on the upper surface 21a, and part of the gate 23 is above the field oxide region 22a. The drain 25 and the source 26 are for example but not limited to N-type, and formed beneath the upper surface 21a at two sides of the gate 23 respectively, wherein the drain 25 and the source 26 are separated by the gate 23 and the field oxide region 22a from top view, and the drain 25 is formed in the high voltage well 24. The body region 27 is for example but not limited to P-type, and formed in the substrate 21 beneath the upper surface 21a, wherein the source 26 is located in the body region 27.

In this embodiment, the LDMOS device region 210 and the DDDMOS device region 220 are arranged in an alternating order in a width direction w and are physically connected or electrically connected to each other. The LDMOS device region 210 and the DDDMOS device region 220 share one common high voltage well 24, or it may be regarded as that the LDMOS device region 210 has one high voltage well 24 and the DDDMOS device region 220 has another high voltage well 24, and these high voltage wells 24 are connected to each other. Similarly, the isolation region 22, the gate 23, the drain 25, the source 26, the body region 27, and the body electrode 27a may be regarded respectively as isolation regions 221 and 222, gates 231 and 232, drains 251 and 252, sources 261 and 262, body regions 271 and 272, and body electrodes 271a and 272a physically connected or electrically connected to each other, one of the LDMOS device region 210 and the other of the DDDMOS device region 220. This arrangement is advantageous over the prior art in that: First, the hybrid high voltage device of the present invention has a relatively lower conduction resistance. Second, in manufacturing process, no additional process step or mask is required, that is, the isolation regions 221 and 222, the gates 231 and 232, the drains 251 and 252, the sources 261 and 262, the body regions 271 and 272, and the body electrodes 271a and 272a may be formed by the same process steps respectively without any additional process step. As such, the hybrid high voltage device in the present invention has a lower conduction resistance while it can be manufactured by a low cost.

More specifically, the prior art high voltage device includes the field oxide region, which induces an oxide enhanced diffusion (OED) effect, such that the carrier density beneath the field oxide region is relatively lower, and therefore, when the high voltage device operates in an OFF condition, the depletion region is enlarged beneath the field oxide region, such that the electric field is decreased, and the breakdown voltage is increased. However, this arrangement increases the conduction resistance of the high voltage device and thus the application range of the high voltage device is limited. According to the present invention, the LDMOS device region 210 and the DDDMOS device region 220 are connected to each other and arranged in an alternating order in a width direction w (indicated by the arrow shown in FIGS. 2B-2D). This arrangement is advantageous in that, according to the first embodiment of the present invention, when the hybrid high voltage 200 operates in an ON condition, part of the conduction current may flow through the DDDMOS device region 220, such that the conduction resistance is decreased, and the conduction characteristics of the high voltage device are enhanced. On the other hand, when the hybrid high voltage device 200 operates in the OFF condition, the field oxide region 221a of the LDMOS device region 210 next to the LDMOS device region 220 in the width w direction induces the reduced surface field (RESURF) effect, such that the depletion region in the channel of the DDDMOS device region 220 is enlarged, and therefore, the surface electric field is decreased, and the breakdown voltage of the hybrid high voltage device 200 is increased. In one embodiment, for enhancing the RESURF effect, as shown in FIG. 2C, a width w1 of the DDDMOS device region 220 is preferably not larger than 0.4 um. FIG. 2C also shows that, the LDMOS device region (or regions) 210 and the DDDMOS device region (or regions) 220 may be integrated to one single device by connecting the gates 231 and 232, the drains 251 and 252, the sources 261 and 262, the body regions 271 and 272 respectively, and the gates 231 and 232 may have (but not necessarily) the same channel length.

Note that the DDDMOS device region 220 (the vent device region) of the hybrid high voltage device 200 may be replaced by other semiconductor device structures, as long as the following conditions are met. First, the vent device region has a lower conduction resistance compared to which of the LDMOS device region 210. Second, the vent device region and the LDMOS device region 210 are physically connected or electrically connected and arranged in an alternating order in the width direction w. Third, the source, the drain, the body region, and the gate of the vent device are physically connected or electrically connected to the source 261, the drain 251, the body region 271, and the gate 231 of the LDMOS device region 210 respectively. For example, the drain of the vent device region may be formed adjacent to one side of the gate beneath the upper surface, but not separated from the gate 232 by the high voltage well 24 (unlike the drain 252 of the DDDMOS device region 220), such that the conduction resistance may be further decreased.

Figure 3:
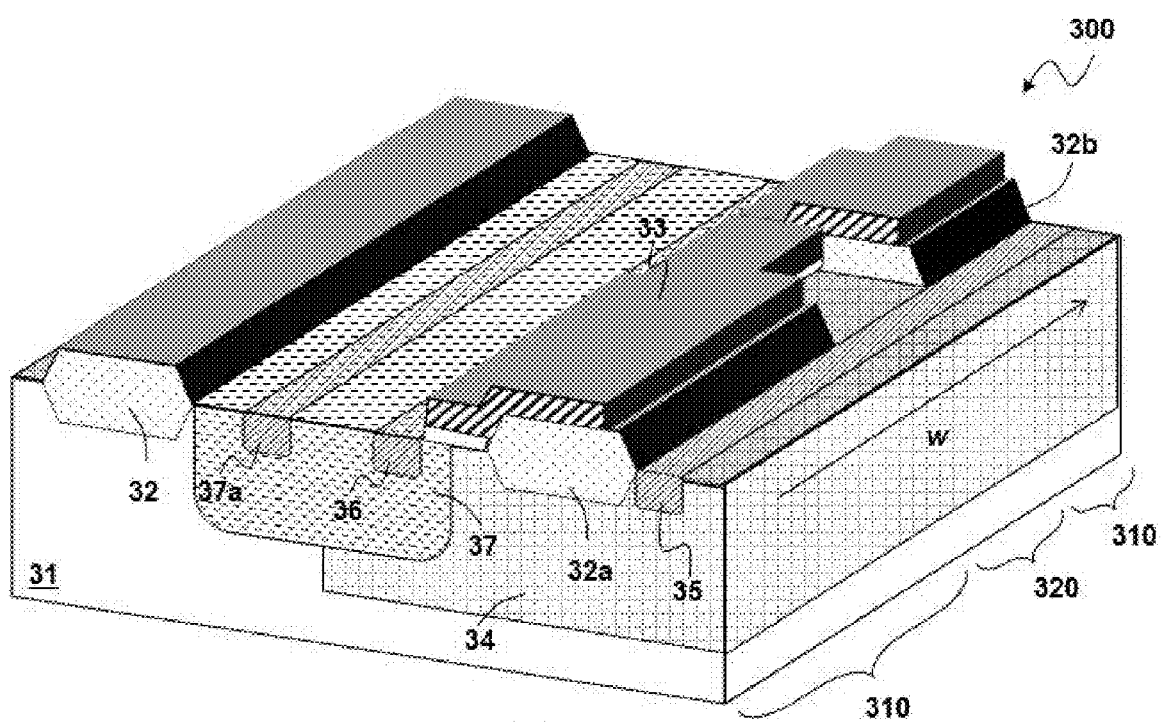
FIG. 3 shows a second embodiment of the present invention.

FIG. 3 shows a second embodiment of the present invention. FIG. 3 is a schematic diagram showing a 3D view of a hybrid high voltage device 300 of the present invention. This embodiment is different from the first embodiment. In the first embodiment, the body region 27 is isolated from the substrate 21 by the high voltage well 24, such that the hybrid high voltage device 200 may be used as a high side device in a power supply circuit. As shown in FIG. 3 of this embodiment, a device region is defined by the isolation region 32, and the hybrid high voltage device 300 includes a LDMOS device region (or regions) 310 and a DDDMOS device region (or regions) 320, which are arranged in an alternating order in a width w direction (as indicated by the arrow shown in the figure) and physically connected or electrically connected to each other. The LDMOS device region 310 includes a field oxide region 32a. The LDMOS device region 310 and the DDDMOS device region 320 include a common gate 33, a common drain 35, a common source 36, a common body region 37, and a common body electrode 37a. This embodiment is different from the first embodiment in that, in this embodiment, part of the body region 37 is electrically connected to the substrate 31, such that the hybrid high voltage device 300 may be used as a low side device in a power supply circuit.

Figure 4:
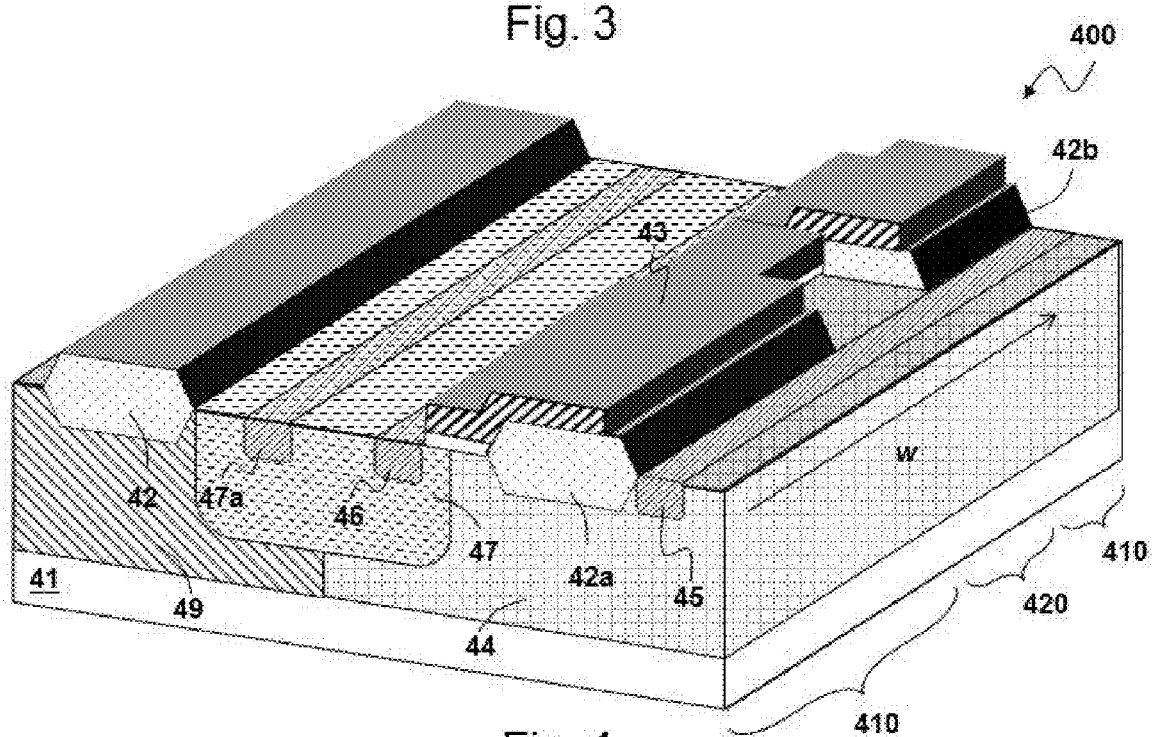
FIG. 4 shows a third embodiment of the present invention.

FIG. 4 shows a third embodiment of the present invention. FIG. 4 is a schematic diagram showing a 3D view of a hybrid high voltage device 400 of the present invention. As shown in the figure, a device region is defined by the isolation region 42, and the hybrid high voltage device 400 includes a LDMOS device region (or regions) 410 and a DDDMOS device region (or regions) 420, which are arranged in an alternating order in a width w direction (as indicated by the arrow shown in the figure) and physically connected or electrically connected to each other. The LDMOS device region 410 includes a field oxide region 42a. The LDMOS device region 410 and the DDDMOS device region 420 include a common gate 43, a high voltage well 44, a common drain 45, a common source 46, a common body region 47, and a common body electrode 47a. This embodiment is different from the second embodiment in that, in this embodiment, part of the body region 47 is electrically connected to the substrate 41 by a P-type common connection well 49 of the LDMOS device region 410 and the DDDMOS device region 420, such that the hybrid high voltage device 400 may be used as a low side device in a power supply circuit.

Figure 5A:
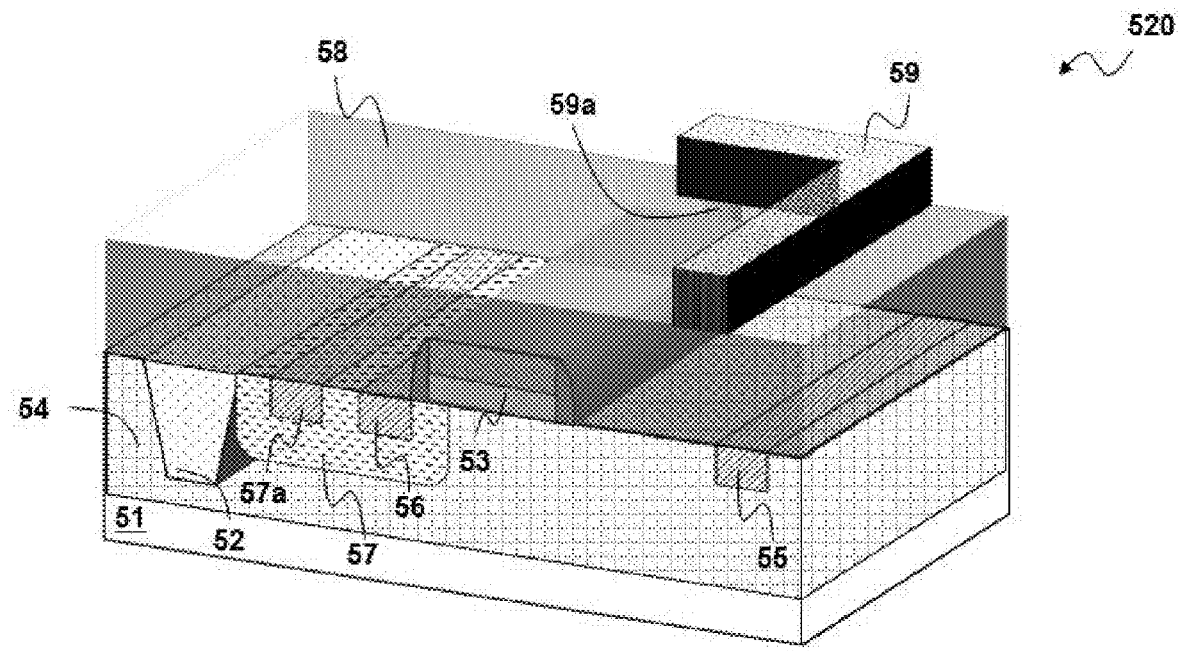
FIGS. 5A-5B show a fourth embodiment of the present invention.
Figure 5B:
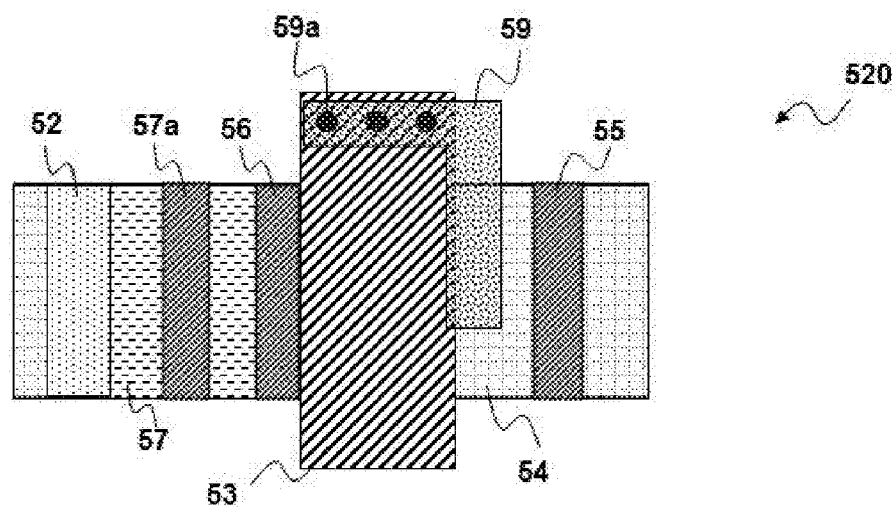

FIGS. 5A-5B show a fourth embodiment of the present invention. FIGS. 5A and 5B are schematic diagrams showing a 3D view and a top view of a more specific embodiment of a DDDMOS device region 520 according to the present invention. As shown in FIG. 5A, the DDDMOS device region 520 is formed within a device region in a substrate 51 which is defined by an isolation region 52. Besides a gate 53, a high voltage well 54, a drain 55, a source 56, a body region 57, and a body electrode 57a, the DDDMOS device region 520 further includes a dielectric layer 58, at least one conductive plug 59a, and a conductive layer 59. As shown in FIG. 5A, the dielectric layer 58 made of a dielectric material is formed by a deposition process. The dielectric layer 58 is formed on the high voltage well and the gate 53, and the dielectric layer 58 covers substantially all over the DDDMOS device region 520, including the gate 53 and the drain 55. As shown in FIG. 5A, a conductive plug 59a is formed by for example but not limited to a lithography process, an etching process, a deposition process, and a chemical mechanical polishing (CMP) process, etc. Note that in order to better illustrate the major feature of the present invention, a single conductive plug 59a is shown in FIG. 5A, but the quantity of the conductive plug 59a may be plural, and it may be in contact with the gate 53 directly, or arranged outside the device region. As shown in FIGS. 5A and 5B, a conductive layer 59 made of conductive material is formed on the dielectric layer 58 by for example but not limited to a deposition process, a lithography process, and an etching process. The conductive material is for example but not limited to metal, such as aluminum or copper. In a preferred embodiment, the conductive layer 59 is formed by process steps which also form a first metal layer of the DDDMOS device region 520 (not shown). Note that, as shown in FIG. 5B, the conductive layer 59 overlaps at least part of the high voltage well 54 between the gate 53 and the drain 56 from top view.

Note that, by the conductive layer 59 which is formed on the dielectric layer 58 and overlaps at least part of the high voltage well 54, no matter whether the DDDMOS device region 520 of this embodiment operates in an ON or OFF condition, the conductive layer 59 generates an electric field, which modifies an electric field in a channel of the DDDMOS device region 520 through the dielectric layer 58, such that when the DDDMOS device region 520 operates in the ON condition, a gate induced drain leakage (GIDL) current can be decreased, and when the DDDMOS device region 520 operates in the OFF condition, the band to band tunneling (BTBT) effect can be mitigated; furthermore, this embodiment also increases the breakdown voltage of the DDDMOS device region 520.

Figure 6:
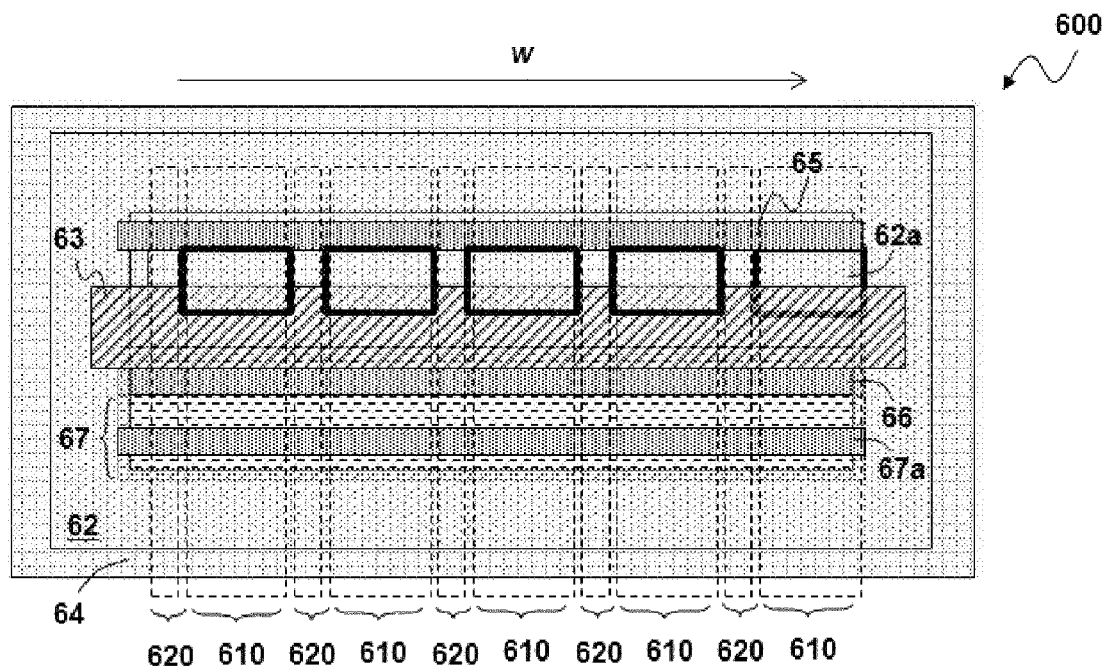
FIG. 6 shows a fifth embodiment of the present invention.

FIG. 6 shows a fifth embodiment of the present invention. FIG. 6 is a schematic diagram showing a top view of a hybrid high voltage device 600 of the present invention. As shown in the figure, a device region is defined by the isolation region 62, and the hybrid high voltage device 600 includes multiple LDMOS device regions 610 and multiple DDDMOS device regions 620, which are arranged in an alternating order in a width w direction (as indicated by the arrow shown in the figure) and physically connected or electrically connected to each other. The LDMOS device region 610 includes a field oxide region 62a (as indicated by a bold frame in the figure). The LDMOS device region 610 and the DDDMOS device region 620 include a common gate 63, a high voltage well 64, a common drain 65, a common source 66, a common body region 67, and a common body electrode 67a. This embodiment indicates that the hybrid high voltage device according to the present invention may include multiple LDMOS device regions and multiple DDDMOS device regions.

Figure 7:
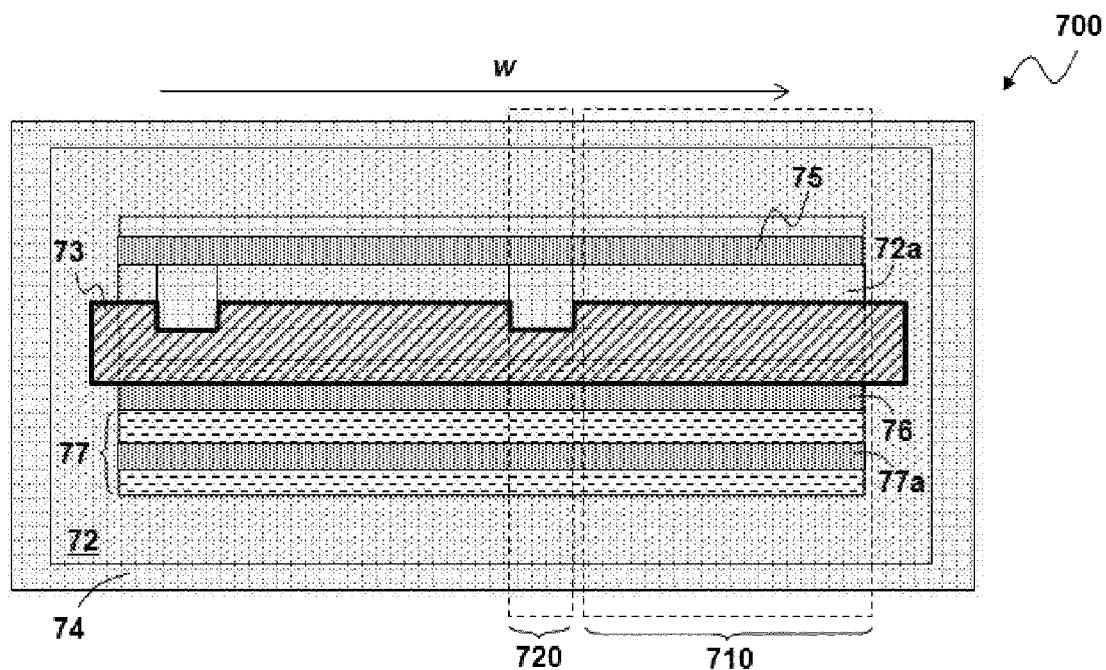
FIG. 7 shows a sixth embodiment of the present invention.

FIG. 7 shows a sixth embodiment of the present invention. FIG. 7 is a schematic diagram showing a top view of a hybrid high voltage device 700 of the present invention. As shown in the figure, a device region is defined by the isolation region 72, and the hybrid high voltage device 700 includes multiple LDMOS device regions 710 and multiple DDDMOS device regions 720, which are arranged in an alternating order in a width w direction (as indicated by the arrow shown in the figure) and physically connected or electrically connected to each other. The LDMOS device region 710 includes a field oxide region 72a. The LDMOS device region 710 and the DDDMOS device region 720 include a common gate 73 (as indicated by a bold frame in the figure), a high voltage well 74, a common drain 75, a common source 76, a common body region 77, and a common body electrode 77a. This embodiment indicates that, in the hybrid high voltage device according to the present invention, the shape of the gate is not limited to a rectangle shape from top view as the aforementioned embodiments, and besides, the length of the gate may be modified according to the requirement.

Figure 8:
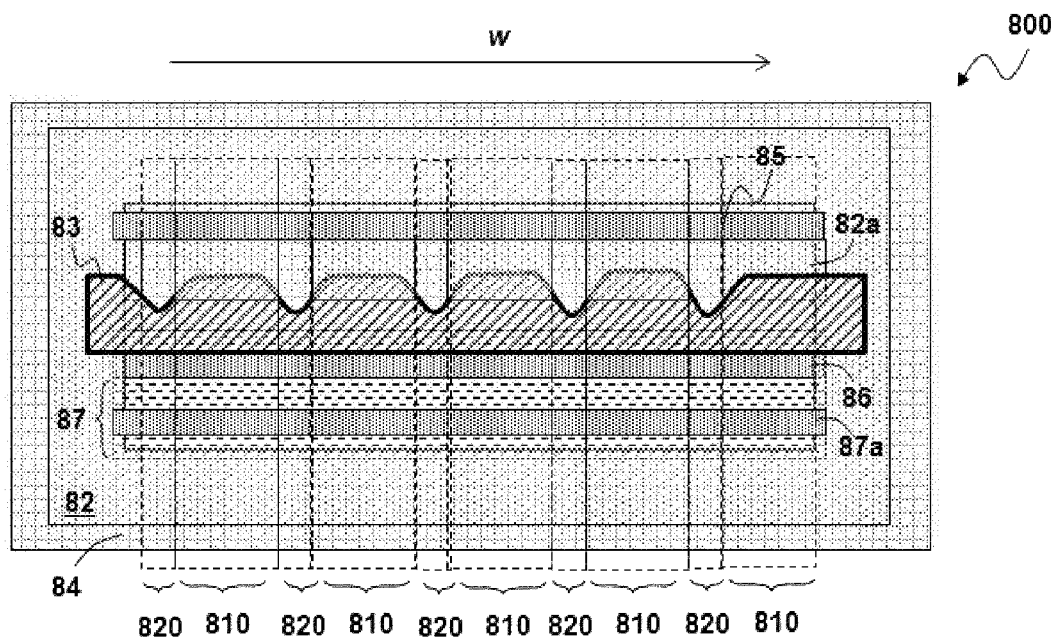
FIG. 8 shows a seventh embodiment of the present invention.

FIG. 8 shows a seventh embodiment of the present invention. FIG. 8 is a schematic diagram showing a top view of a hybrid high voltage device 800 of the present invention. As shown in the figure, a device region is defined by the isolation region 82, and the hybrid high voltage device 800 includes multiple LDMOS device regions 810 and multiple DDDMOS device regions 820, which are arranged in an alternating order in a width w direction (as indicated by the arrow shown in the figure) and physically connected or electrically connected to each other. The LDMOS device region 810 includes a field oxide region 82a. The LDMOS device region 810 and the DDDMOS device region 820 include a common gate 83 (as indicated by a bold frame in the figure), a high voltage well 84, a common drain 85, a common source 86, a common body region 87, and a common body electrode 87a. This embodiment indicates that, in the hybrid high voltage device according to the present invention, the shape of the gate is not limited to a rectangle shape from top view as the aforementioned embodiments. The length of the gate may be modified according to the requirement, and the shape of the gate may be saw-toothed from top as shown in FIG. 8 of this embodiment.

Figure 9:
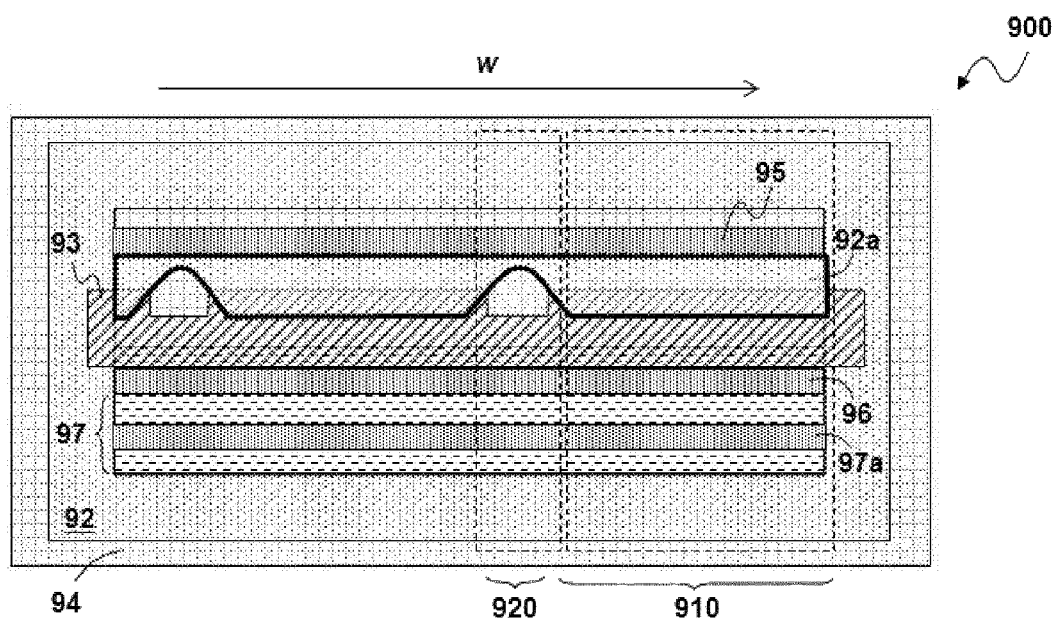
FIG. 9 shows an eighth embodiment of the present invention.

FIG. 9 shows an eighth embodiment of the present invention. FIG. 9 is a schematic diagram showing a top view of a hybrid high voltage device 900 of the present invention. As shown in the figure, a device region is defined by the isolation region 92, and the hybrid high voltage device 900 includes multiple LDMOS device regions 910 and multiple DDDMOS device regions 920, which are arranged in an alternating order in a width w direction (as indicated by the arrow shown in the figure) and physically connected or electrically connected to each other. The LDMOS device region 910 and the DDDMOS device region 920 include a common field oxide region 92a (as indicated by a bold frame in the figure). Besides, the LDMOS device region 910 and the DDDMOS device region 920 include a common gate 93, a high voltage well 94, a common drain 95, a common source 96, a common body region 97, and a common body electrode 97a. This embodiment indicates that, in the hybrid high voltage device according to the present invention, the shape of the field oxide region is not limited to separated rectangle shapes from top view as the aforementioned embodiments, but instead, the field oxide region may be integrated to one piece from top view as shown in FIG. 9 of this embodiment, with modification of the length (relatively shorter) in the DDDMOS device region in the channel length direction of the hybrid high voltage device.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography, X-ray lithography, etc.; for another example, the shape of the aforementioned hybrid high voltage devices according to the present invention from top view is not limited to a rectangular shape, but it may be changed to other shapes such as a circular or serpent shape. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A manufacturing method of a hybrid high voltage device, comprising:
   providing a first conductive type substrate, wherein the substrate has an upper surface;
   forming at least one lateral double diffused metal oxide semiconductor (LDMOS) device region in the substrate; and
   forming at least one double diffused drain metal oxide semiconductor (DDDMOS) device region in the substrate;
   wherein the LDMOS device region and the DDDMOS device region are arranged in an alternating order in a width direction, and a first source, a first drain, a first body region, and a first gate of the LDMOS device region are formed by common steps with and are physically connected or electrically connected to a second source, a second drain, a second body region, and a second gate of the DDDMOS device region respectively.

2. The manufacturing method of claim 1, wherein the steps of forming the LDMOS device region and the DDDMOS device region include:
   forming a second conductive type high voltage well in the substrate beneath the upper surface;
   forming a field oxide region on the upper surface, wherein the field oxide region is located in the high voltage well from top view;
   forming the first gate and the second gate on the upper surface, wherein part of the first gate is above the field oxide region, and the first gate and the second gate are connected to each other;
   forming the second conductive type first source and the second conductive type first drain beneath the upper surface at two sides of the first gate respectively, and forming the second conductive type second source and the second conductive type second drain beneath the upper surface at two sides of the second gate respectively, wherein the first drain and the first source are separated by the first gate and the field oxide region from top view, and the second drain and the second source are separated by the second gate from top view, and wherein the first drain and the second drain are formed in the high voltage well, and the first source and the second source being connected to each other, and the first drain and the second drain being connected to each other; and
   forming the first conductive type first body region and second body region in the substrate beneath the upper surface, wherein the first source is in the first body region, and the second source is in the second body region, the first body region and the second body region being connected to each other.

3. The manufacturing method of claim 2, wherein the first body region and the second body region are isolated from the substrate by the high voltage well, such that the first body region and the second body region are not in direct contact with to the substrate.

4. The manufacturing method of claim 2, further comprising:
   forming a dielectric layer above the second gate and the high voltage well; and
   forming a conductive layer above the dielectric layer, wherein the conductive layer overlaps at least part of the high voltage well between the second gate and the second drain from top view.

5. The manufacturing method of claim 4, wherein the conductive layer is electrically connected to the second gate.

6. The manufacturing method of claim 1, wherein the DDDMOS device region has a width not wider than 0.4 um.

7. The manufacturing method of claim 1, wherein at least part of the first body region and at least part of the second body region are physically connected to the substrate, or indirectly connected to the substrate through a first conductive type connection well, such that the first body region and the second body region are electrically connected to the substrate.

* * * * *